United States Patent
Okuyama

(10) Patent No.: US 10,756,464 B2
(45) Date of Patent: Aug. 25, 2020

(54) CONNECTOR ASSEMBLY AND CONNECTOR ELEMENTS

(71) Applicant: Hirose Electric Co., Ltd., Shinagawa-ku, Tokyo (JP)

(72) Inventor: Takeshi Okuyama, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/380,732

(22) Filed: Apr. 10, 2019

(65) Prior Publication Data

US 2019/0319383 A1    Oct. 17, 2019

(30) Foreign Application Priority Data

Apr. 11, 2018    (JP) .................. 2018-075892

(51) Int. Cl.
*H01R 12/71* (2011.01)
*H01R 31/06* (2006.01)
*H01R 43/26* (2006.01)

(52) U.S. Cl.
CPC ........... *H01R 12/716* (2013.01); *H01R 31/06* (2013.01); *H01R 43/26* (2013.01)

(58) Field of Classification Search
CPC ....... H01R 12/716; H01R 31/06; H01R 43/26
USPC ......................................................... 439/74
See application file for complete search history.

(56) References Cited

U.S. PATENT DOCUMENTS

| | | | | |
|---|---|---|---|---|
| 8,721,350 | B2* | 5/2014 | Liu ..................... | H01R 13/6315 439/65 |
| 9,184,523 | B2* | 11/2015 | Tamai .................. | H01R 31/06 |
| 10,283,913 | B2* | 5/2019 | Takeuchi ........... | H01R 13/6594 |
| 10,297,966 | B1* | 5/2019 | Hamner ............. | H01R 13/6591 |

FOREIGN PATENT DOCUMENTS

JP    2015-060657 A    3/2015

* cited by examiner

*Primary Examiner* — Alexander Gilman
(74) *Attorney, Agent, or Firm* — Procopio, Cory, Hargreaves & Savitch LLP

(57) ABSTRACT

A connector assembly having three types of connector elements including a first connector 10 and a second connector 20, each of which is respectively mounted to one of two mounting members P1, P2, and an intermediate connector 30, which is located between the two connectors, i.e., the first connector 10 and the second connector 20, and is connected to the two connectors, wherein one of the three types of connector elements has protrusion portions 52;13C protruding in the direction of connection of the connector elements, said protrusion portions are abuttable against other connector elements or mounting members with an abutment force, and, in the process of connection of the connector elements, the above-mentioned protrusion portions are deformable in the above-mentioned direction of connection by abutment forces that exceed the sliding forces acting between the terminals 43, 14, 24 of the connector elements.

4 Claims, 6 Drawing Sheets

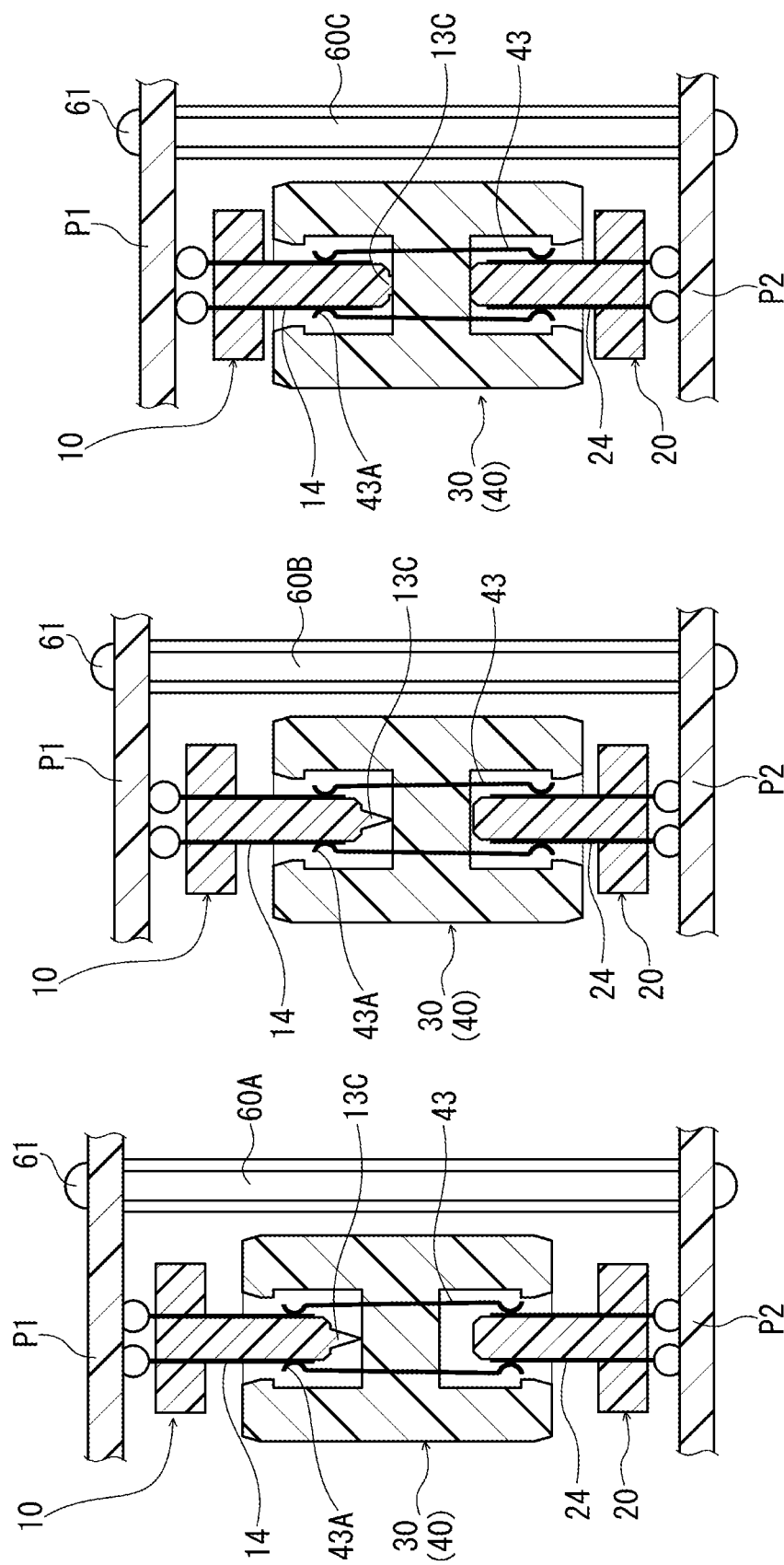

CONNECTOR ASSEMBLY AND CONNECTOR ELEMENTS

CROSS REFERENCE TO RELATED APPLICATIONS

This Paris Convention Patent Application claims benefit under 35 U.S.C. § 119 and claims priority to Japanese Patent Application No. JP 2018-075892, filed on Apr. 11, 2018, titled "CONNECTOR ASSEMBLY AND CONNECTOR ELEMENTS", the content of which is incorporated herein in its entirety by reference for all purposes.

BACKGROUND

Technical Field

The present invention relates to a connector assembly and to connector elements used in the connector assembly.

Background Art

A connector assembly in which two connectors are respectively mounted to mounting members on different circuit boards, etc., and the two connectors are interconnected via an intermediate connector, thereby electrically connecting the two circuit boards, has been disclosed, for example, in Patent Document 1.

The connector assembly of Patent Document 1 is constructed such that separate connectors (counterpart connectors in Patent Document 1) are mounted to each of the two circuit boards and these two connectors are connected by an intermediate connector (relay connector). In such a connector assembly, the circuit board-side connectors and the intermediate connector are the connector elements of said connector assembly.

The distance between the two circuit boards is determined to be a constant predetermined distance because the two circuit board-side connectors are assembled in a standard connector mating position used for mating with the intermediate connector. The circuit board-side connectors are designed to allow pairs of terminals to slide a predetermined length in the connector-mating direction to ensure the dependability of contact of paired terminals between the circuit board-side connectors and the intermediate connector. The maximum slidable length is called the "effective mating length" and the actual length of sliding within this effective mating length is called the "sliding length".

The thus-configured connector assembly of Patent Document 1 is fitted together by mating the intermediate connector with a first circuit board-side connector and, subsequently, mating a second circuit board-side connector with said intermediate connector. When the intermediate connector is mated with the first circuit board-side connector, a stable, deeply mated state is obtained by increasing the inter-terminal sliding length to extend throughout the entire effective mating length. After that, in the same manner as in the first circuit board-side connector, the second circuit board-side connector is mated deeply with the intermediate connector for a long sliding length extending throughout the entire effective mating length. Therefore, when the connector assembly is in a stable standard position, the distance between the two circuit boards naturally becomes smaller because the sliding length is increased to extend throughout the entire effective mating length and both circuit board-side connectors are deeply mated with the intermediate connector in the stable standard position.

Sometimes there is also a need to make the distance between the two circuit boards in electronic devices equipped with the thus-configured connector assemblies larger than the distance obtained in the mated state in the above-mentioned standard position.

In the connector assembly of Patent Document 1, the intermediate connector needs to remain in a stable state by being deeply mated with the first circuit board-side connector for a long sliding length and, therefore, in order to meet this need, the mating of the second circuit board-side connector with the intermediate connector needs to be stopped in progress to get a shorter sliding length and thus make the distance between the two circuit boards larger in comparison with the mated state in the above-mentioned standard position.

PRIOR ART LITERATURE

Patent Documents

[Patent Document 1]
Japanese Published Patent Application No. 2015-060657

SUMMARY

Problems to be Solved

However, in the case of Patent Document 1, deeply mating the first circuit board-side connector with the intermediate connector for a long sliding length and mating only the second circuit board-side connector with the intermediate connector less deeply than in the standard position for a shorter sliding length allows for the distance between the circuit boards to be made only slightly larger than during connector mating in the standard position.

Moreover, in addition to the fact that the distance between the circuit boards cannot be made sufficiently large with such an adjustment, since the second circuit board-side connector and the intermediate connector do not have means serving as stoppers that delimit the depth of mutual mating, the distance between the circuit boards becomes undefined and their position unstable.

The longer the sliding length between pairs of terminals, the higher the certainty of connection between the pairs of terminals. However, on the other hand, the free length protruding from the point of contact between the pairs of terminals forms a branch path deviating from the shortest signal flow path, i.e., a so-called "stub", which becomes a signal reflection path during high-speed signal transmission and makes favorable signal transmission impossible.

Accordingly, there are conflicting requirements, according to which it would be desirable to minimize the stub effect while ensuring terminal contact dependability and, at the same time, increase the distance between the two circuit boards in a stable manner.

Thus, it is an object of the present invention to provide a connector assembly in which the sliding length can be adjusted depending on the conditions of terminal use, and the distance between the two circuit boards can be selected and secured by stabilizing the sliding length in this position, as well as connector elements therefor.

Technical Solution

In accordance with the present invention, the above-described object is attained by an electrical connector assembly configured as follows and the connector elements used in said connector assembly. It is an object of the invention to provide a connector assembly in which the sliding length of the terminals is adjusted depending on the conditions of use of the terminals and the distance between the two circuit boards can be selected and secured in place by stabilizing the sliding length in this position, as well as connector elements therefor.

<Connector Assembly>

The inventive connector assembly has three types of connector elements including a first connector and a second connector, each of which is respectively mounted to one of two mounting members, and an intermediate connector, which is located between the two connectors, i.e., the first connector and the second connector, and is connected to the two connectors.

The connector assembly is characterized by the fact that one of the three types of connector elements has protrusion portions protruding in the direction of connection of the pairs of connector elements, said protrusion portions are abuttable against other connector elements or mounting members with an abutment force, and, in the process of connection of the pairs of connector elements, the above-mentioned protrusion portions are deformable by abutment forces that exceed the sliding forces acting between the terminals of the connector elements in the above-mentioned direction of connection.

In the present invention, the connector elements that have the protrusion portions can be adapted to have a connector main body and a frame portion, to which said connector main body is mounted, with the protrusion portions provided on said frame portion.

In the present invention, the protrusion portions can be adapted to be capable of plastic crush deformation or capable of elastic deformation.

The present invention may be adapted such that the mounting members are circuit boards.

<Connector Elements>

In the present invention, the connector elements are characterized by serving as connector elements used in the above-described connector assembly and having protrusion portions capable of deformation in the process of connection of the pairs of connector elements.

<Principle of the Invention>

In the inventive connector assembly and connector elements, protrusion portions are formed on one of the three types of connector elements located between the two mounting members, and the protrusion portions are deformed by abutment forces between them and other connector elements exceeding the sliding force of the terminals.

According to the invention, the extent of mating between two connector elements, depending on whether the above-mentioned protrusion portions are deformed or not, determines different distances between the two circuit boards. In the initial abutment state or in the deformed state of the protrusion portions, the protrusion portions abut other connector elements, and, as a result of such abutment, the positions of the connector elements are stabilized.

In the present invention, if the connector element that has the protrusion portions is divided into a connector main body and a frame portion equipped with protrusion portions, the distance between the two circuit boards is readily altered by simply modifying or selecting the frame portion without changing the connector main body.

The type of deformation of the protrusion portions can be either plastic crush deformation or elastic deformation, with elastic deformation allowing for re-assembly of the connector assembly.

Technical Effect

As described above, in the present invention, one of the three types of connector elements located between the two mounting members has formed therein protrusion portions protruding in the direction of connection of the connector elements, said protrusion portions are abuttable with an abutment force against mounting members or other connector elements that do not have protrusion portions, and, in the process of connection of the pairs of connector elements, the above-mentioned protrusion portions are made deformable by abutment forces that exceed sliding forces acting between the terminals of the pairs of connector elements in the above-mentioned direction of connection, as a result of which, when the connector elements that have the protrusion portions abut against other connector elements, the protrusion portions undergo deformation under the action of said abutment forces exceeding the sliding forces acting between the terminals. Therefore, in the present invention, different distances between the two circuit boards can be set depending on whether the protrusion portions are allowed to be deformed or not, and, furthermore, the position of the connector elements can be stabilized because the protrusion portions abut other connector elements both in the initial abutment state and in the deformed state.

BRIEF DESCRIPTION OF DRAWINGS

FIG. 6 (A) to 6 (C) A cross-sectional assembled view of the connector assembly of FIG. 5 using three types of spacers of different heights, wherein FIG. 6 (A) depicts a tall spacer, FIG. 6 (B) an intermediate-height spacer, and FIG. 6 (C) a low-height spacer.

DETAILED DESCRIPTION

A connector assembly representing an embodiment of the present invention is discussed below with reference to the accompanying drawings.

Figure 1:
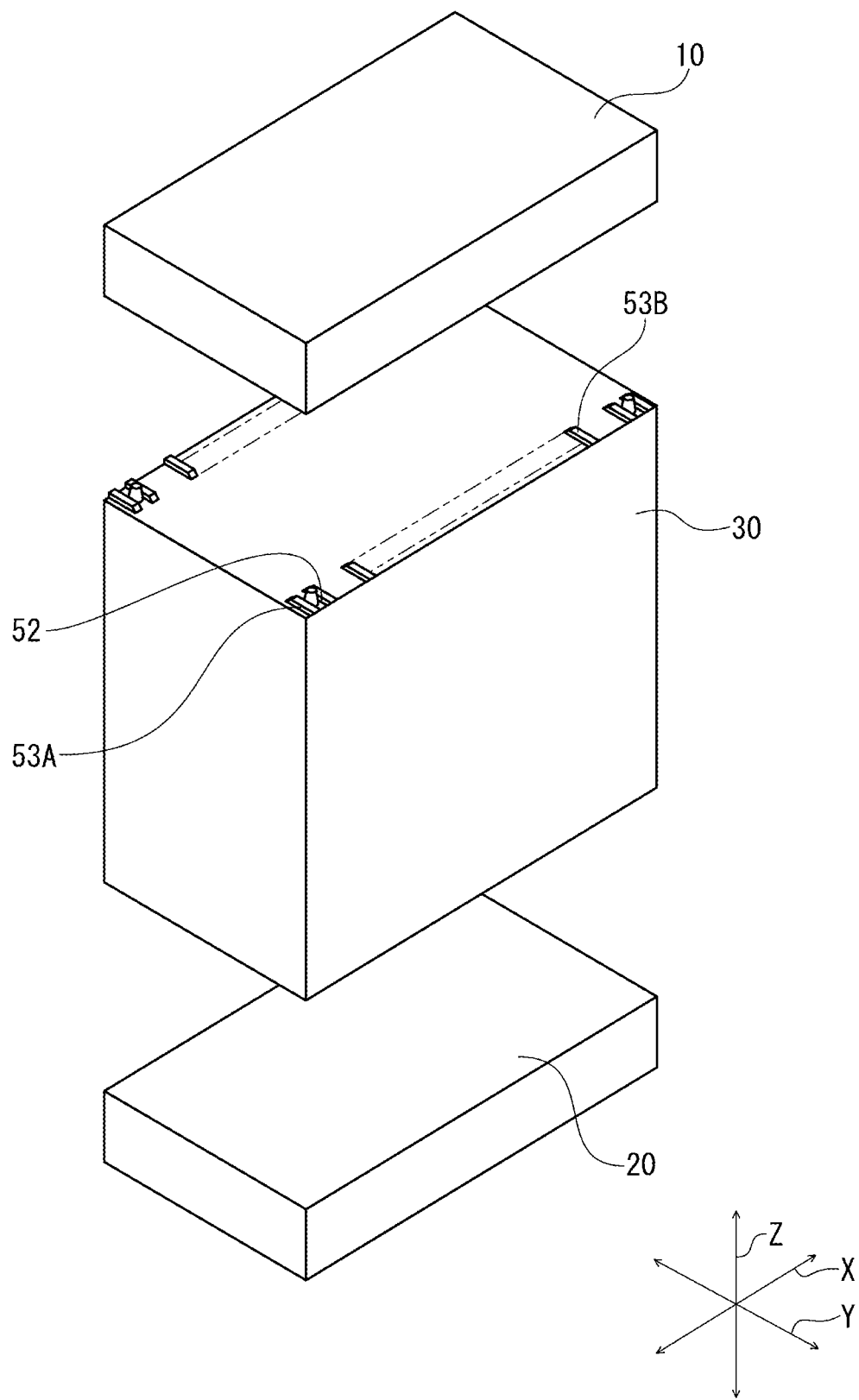
FIG. 1 A perspective view illustrating the overall configuration of a connector assembly used in an embodiment of the present invention in a state in which each connector element is positioned separately.

FIG. 1 is a perspective view illustrating the overall configuration of the connector assembly used in the present embodiment in a state in which each connector element is positioned separately. The connector assembly of the present embodiment is configured by combining a plurality of connector elements and accessory elements. In FIG. 1, each connector element and accessory element is illustrated in an isolated state prior to assembly.

Figure 2:
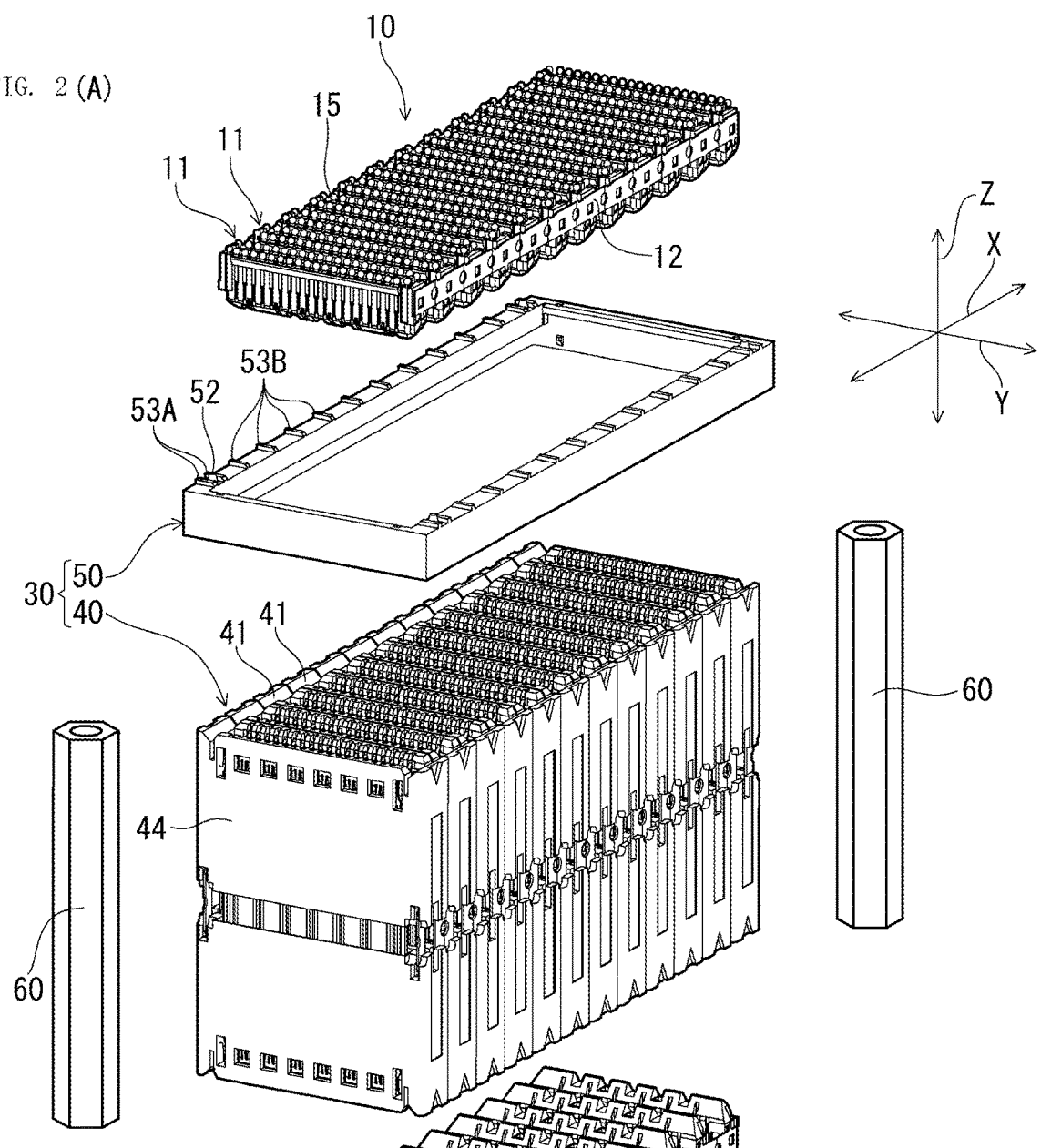
FIGS. 2 (A) to 2 (B) A perspective view of the connector assembly illustrating the appearance of each connector element of FIG. 1 in more specific detail, wherein FIG. 2 (A) is an overall view and FIG. 2 (B) is an enlarged view of the periphery of the protrusion portions.
Figure 2:
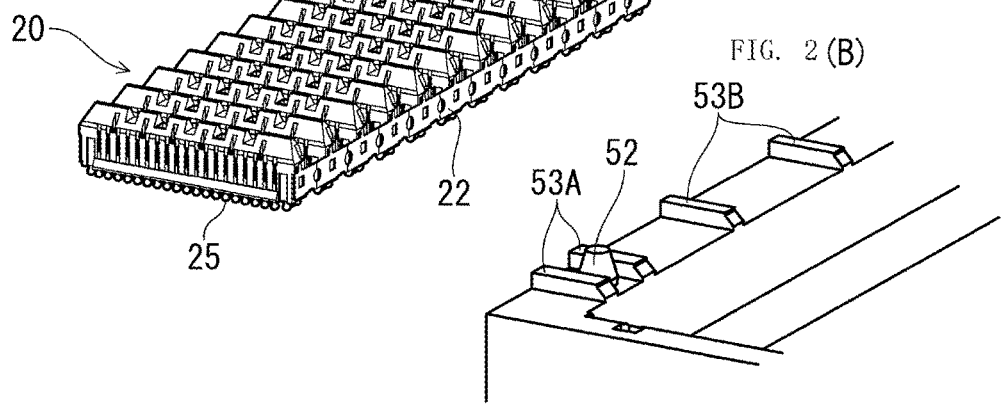

In FIG. 1, the connector elements making up the connector assembly of the present embodiment include a first connector 10, which is located at the top, a second connector 20, which is located at the bottom, and an intermediate connector 30, which is located between these two connectors 10 and 20. In FIG. 2 (A), which illustrates a specific example of the connector assembly of FIG. 1, two spacers 60 are provided as accessory elements in addition to these connector elements.

In the present embodiment illustrated in FIG. 1, both the first connector 10 and the second connector 20 have the same configuration. However, since they are disposed at different locations in the vertical direction and are facing away from each other in the vertical direction, the first connector 10 and the second connector 20 are assigned different names and reference numerals in order to discriminate between the two.

The first connector 10 and the second connector 20 are mounted to respective mounting members, e.g., circuit boards (not shown). The first connector 10 has its top face mounted to a circuit board serving as a mounting member and the second connector has its bottom face mounted to another circuit board serving as a mounting member.

FIG. 2 (A) below provides a specific illustration of the connector assembly. In FIG. 2 (A), as discussed before, the connector assembly has spacers 60 serving as accessory elements in addition to the first connector 10, second connector 20, and intermediate connector 30 serving as connector elements. Hereinbelow, each element will be discussed in sequence with reference to FIG. 2 (A), which illustrates their detailed structure.

Although the first connector 10 and second connector 20 have the same configuration, they are facing away from each other in the vertical direction. For this reason, in FIG. 2 (A), the first connector 10 is illustrated with its connection side, which is to be mounted to a circuit board P1 serving as a mounting member, shown facing up, and the second connector 20 is illustrated with its mating side, which is to be mated with the intermediate connector 30, also shown facing up (see also FIG. 3). Therefore, the connection side of the two connectors 10, 20 will be discussed with reference to the first connector 10 and their mating side will be discussed with reference to the second connector 20. In FIG. 1 and FIG. 2 (A), to simplify the understanding of directions, 3D space coordinates are configured by designating the connector-height direction, in other words, the direction of connector mating and unmating, as Z, the connector-length direction as X, and the connector-width direction as Y.

In the first connector 10, multiple connector elements 11 extending in the connector-width direction Y are arranged in the connector-length direction X and securing bands 12 of sheet metal extending in the connector-length direction X are mounted to the end faces of the multiple connector elements 11 in the connector-width direction Y, as a result of which the above-mentioned multiple connector elements 11 form a single elongated connector in the above-mentioned connector-length direction X.

Figure 3:
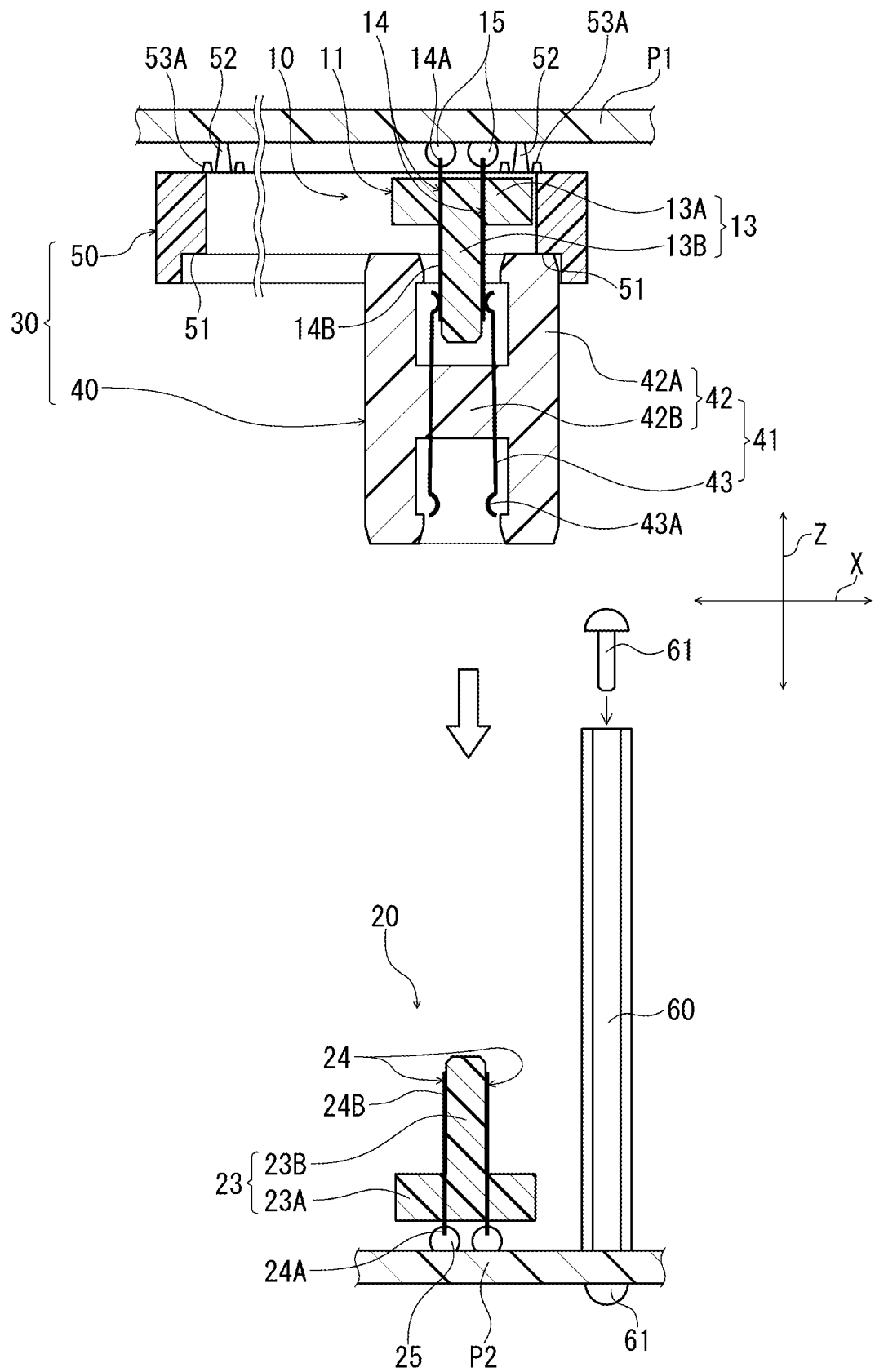
FIG. 3 A cross-sectional view illustrating the initial stage of assembly of the connector assembly of FIGS. 2 (A) to 2 (B).

As can be seen in FIG. 3, each connector element 11 secures terminals 14 in place in an element housing 13 extending in the above-mentioned connector-width direction Y, with solder balls 15 provided at the upper ends of said terminals 14. The connector elements 11 have multiple terminals 14 with the above-mentioned solder balls 15 arranged in the above-mentioned connector-width direction Y. As can be seen in FIG. 3, the cross-section of the above-mentioned connector elements 11, taken in the ZX plane that comprises the connector-length direction X and the connector-height direction Z, is T-shaped and has a horizontal wall portion 13A that passes therethrough to secure a terminal 14 in place in the connector-height direction Z, and a vertical wall portion 13B upstanding from said horizontal wall portion 13A (extending downwardly in FIG. 3). A pair of pin-shaped terminals 14 extending in a rectilinear manner in the connector-height direction Z (vertical direction) are secured in place by the above-mentioned horizontal wall portion 13A and, at the same time, are supported on both of the exterior surfaces of the vertical wall portion 13B. In the present embodiment, the terminals 14 are secured in place in the above-mentioned element housing 13 using unitary co-molding with said element housing 13. In FIG. 3, the above-mentioned terminals 14 pass through the above-mentioned horizontal wall portion 13A to protrude from the top face of said horizontal wall portion 13A, with solder balls 15 mounted to their upper ends 14A. Said solder balls 15 are solder-connected to the corresponding circuitry (not shown) on the circuit board P1 serving as a mounting member, thereby mounting the connector element 11 to the circuit board P1. The sections of the above-mentioned terminals 14 extending vertically along the exterior surface of the vertical wall portion 13B of the element housing 13 form contact portions 14B, which make sliding contact with the terminals of the intermediate connector 30. Although in the state depicted in FIG. 3 the above-described connector element 11 is just one of the multiple connector elements 11 making up the first connector 10, hereinbelow, in the discussion concerning the intermediate connector 30, this single connector element 11 represents the first connector 10.

As described above, the second connector 20, which has the same configuration as the first connector 10, faces away from the first connector 10 in the vertical direction, in other words, is vertically flipped with respect to the first connector 10. Since the second connector 20 has the same configuration as the first connector 10, the description is simplified by designating sections common with the first connector 10 using reference numerals having the prefix "20" obtained by adding "10" to the reference numerals used for the first connector 10.

In the second connector 20, in the same manner as in the first connector 10, multiple connector elements 21 extending in the connector-width direction Y are provided in the connector-length direction X and are coupled by securing bands 22, thereby forming the second connector 20.

In FIG. 3, in the connector elements 21 of the second connector 20, the terminals 24 are secured in place in an element housing 23 having a horizontal wall portion 23A and a vertical wall portion 23B, with the lower ends 24A of the terminals 24 passing downwardly through the horizontal wall portion 23A and having solder balls 25 provided thereon. The top portions of the terminals 24 form contact portions 24B supported on the exterior surfaces of the vertical wall portion 23B. The above-mentioned solder balls 25 are solder-connected to the corresponding circuitry (not shown) on the circuit board P2 serving as a mounting member, thereby mounting the second connector 20 to the circuit board P2. While FIG. 3 shows only one connector element 21 of the multiple connector elements 21 making up the second connector 20, in the discussion concerning the intermediate connector 30, this single connector element 21 represents the second connector 20.

The intermediate connector 30, which is located in the vertical direction between the above-mentioned first connector 10 and second connector 20, has a connector main body 40 and a frame-shaped frame portion 50 mounted to the top portion of said connector main body 40.

The connector main body 40 itself is a vertically symmetrical structure and, in the same manner as the first connector 10 and second connector 20, has multiple connector main body elements 41 extending in the connector-width direction Y provided in the connector-length direction X and housed inside a securing casing 44 made of sheet metal (see FIG. 2 (A)). Said securing casing 44, which has a top and bottom opening, collectively contains and secures in place multiple connector main body elements 41.

The connector main body elements 41 have an element housing 42, whose cross-section, as can be seen in FIG. 3, is H-shaped in the ZX plane that comprises the connector-length direction X and the connector-height direction Z, and a pair of terminals 43 secured in place by said element housing 42. Said pairs of terminals 43 are arranged in multiple locations relative to the element housing 42 in the connector-width direction Y.

As can be seen in FIG. 3, the element housing 42 has a pair of lateral wall portions 42A extending in the connector-height direction Z and a coupling wall portion 42B coupling both lateral wall portions 42A at a center location in the connector-height direction Z.

A pair of terminals 43, which pass through the above-mentioned coupling wall portion 42B in the connector-height direction Z, have a rectilinear configuration and are provided, at their ends, with contact portions 43A convexly curved toward each other in the connector-length direction X. Said pair of terminals 43 are capable of elastic flexural deformation toward and away from one another in the sections protruding from the above-mentioned coupling wall portion 42B, and the above-mentioned pair of contact portions 43A of the pair of terminals 43 clamp the contact portions 14B of the pair of terminals 14 supported on the vertical wall portion 13B of the above-described first connector 10, as a result of which they are brought into resilient pressure contact with said contact portions 14B and apply contact pressure thereto. In the connector-height direction Z, said contact portions 43A are located in positions inwardly offset from the locations of the ends of the above-mentioned lateral wall portions 42A. While the connector main body 40 of the intermediate connector 30 is made up of multiple connector main body elements 41, in FIG. 3, in describing its relationship to the first connector 10 and second connector 20 in FIG. 3, the intermediate connector 30 is represented by a single connector main body element 41 (and frame 50).

The frame portion 50 mounted to the top portion of the above-mentioned connector main body 40 has a frame-like configuration elongated in the connector-width direction Y and is mounted from above to the peripheral edge of the top portion of the connector main body 40 of the intermediate connector 30 formed by collectively securing in place the multiple connector main body elements 41 with the help of the securing casing 44 (FIG. 2 (A) and see FIG. 3). In the present embodiment, the above-mentioned frame portion 50 is releasably mounted to the above-mentioned connector main body 40.

In order to be fitted from above to the above-mentioned connector main body 40, the frame portion 50 has formed therein a stepped inner peripheral surface, in which the distance between inner peripheral surfaces opposed respectively in connector-length direction X and in the connector-width direction Y is made larger in the bottom portion than in the top portion of said frame portion 50, and this stepped portion 51 is fitted to an angular peripheral edge of the top portion of the connector main body 40. While in FIG. 3 the above-mentioned frame portion 50 is shown in a state in which its right end portion in the connector-length direction, as illustrated in FIG. 1, is fitted to the connector main body 40 (the connector main body element 41 located at the right end among the multiple connector main body elements 41), as far as the left end portion is concerned, it is not shown how it is fitted to connector main body elements 41 in said left end portion because the corresponding connector main body element 41 is not illustrated.

As can be seen in FIG. 1 and FIG. 2 (A), narrow columnar protrusion portions 52 extending upwardly in the connector-height direction Z are provided in the vicinity of the four corners of the top face of the frame portion 50 (see also FIG. 2 (B)). Said protrusion portions 52 have an elongated substantially frustoconical shape and are capable of deformation by plastic crushing or resilient bending under the action of external forces from above in the connector-height direction Z. Although the above-mentioned external forces originate from other connector elements or mounting members, in the embodiment illustrated in FIGS. 1-3, said protrusion portions are subject to the abutment force against the circuit board P1 originating from said circuit board P1 as a mounting member. The connector main body 40 of the intermediate connector 30, to which the frame portion 50 is fitted, is mated with the first connector 10 and second connector 20 in the above-mentioned connector-height direction Z. Although at such time the contact portions 43A of the terminals 43 of the intermediate connector 30 slide with contact pressure relative to the contact portions 14B of the terminals 14 of the first connector 10 and the contact portions 24B of the terminals 24 of the second connector 20, a friction force is generated as a sliding force in the direction of sliding. When the abutment force acting on the above-mentioned protrusion portions 52 exceeds the sliding force of the terminals 43, deformation occurs in the protrusion portions 52. In other words, when the intermediate connector 30 is in the process of mating with the first connector 10 and second connector 20, the above-mentioned protrusion portions 52 do not get deformed even when acted upon by the abutment force, the abutment force overcomes the sliding force, and sliding continues such that mating proceeds up to a predetermined depth. Here, the above-mentioned "sliding force" includes the force required to surmount the distal ends of the vertical wall portions 23B and the distal ends of the vertical wall portions 13B when, at the initial stage of mating of the intermediate connector 30 with the first connector 10 and second connector 20, the contact portions 43A of the terminals 43 of the intermediate connector 30 surmount the distal ends of the above mentioned vertical wall portions 13B of the first connector 10 and the distal ends of the vertical wall portions 23B of the second connector 20 and, immediately thereafter, are brought into contact with, respectively, the contact portions 13B of the first connector 10 and the contact portions 23B of the second connector. Hereinafter, the term "sliding force" is used in the same meaning in relation to the magnitude of the sliding force and the abutment force.

As can be seen in FIG. 1 and FIG. 2 (A), projections 53A elongated in the connector-width direction Y and located in close proximity to said protrusion portions 52 are provided on both sides of the above-mentioned protrusion portions 52 of the frame portion 50 (see also FIG. 2 (B)). The height (dimensions in the connector-height direction Z) of said projections 53A is lower than the height of the above-mentioned protrusion portions 52. Therefore, when the protrusion portions 52 are deformed by the abutment force, the projections 53A serve to prevent the deformation of the above-mentioned protrusion portions 52 at the moment when the above-mentioned projections 53A abut the circuit board P1 that exerts the abutment force against said protrusion portions 52. In addition, these projections 53A have the capability to restrict the extent of protrusion in the lateral direction (connector-length direction X) when the protrusion portions 52 are deformed.

As can be seen in FIG. 1 and FIG. 2 (A), in the preferred form of the present embodiment, multiple projections 53B, similar to the above-mentioned projections 53A, are provided at fixed intervals on the upper face extending in the connector-length direction X of the above-mentioned frame portion 50. When the frame portion 50 is subject to the abutment force of the circuit board P1, said multiple projections 53B have the capability to uniformly distribute the action of said abutment force with respect to the frame portion 50 in the above-mentioned connector-length direction X. It should be noted that an illustration of the above-mentioned projections 53B has been omitted in FIG. 3.

In the preferred form of the present embodiment, metal pillar-shaped spacers 60 are provided at multiple locations laterally of the intermediate connector 30, etc. (at two locations in the illustrated example). When the two circuit boards P1, P2 constituting the connector assembly are disposed at a predetermined distance, the height of said spacers 60 is made equal to said predetermined distance. As can be seen in FIG. 3, said spacers 60 are secured to the circuit boards P1, P2 with screws 61.

The assembly procedures of each connector element of the thus-configured connector assembly will be illustrated with reference to FIGS. 3 and 4 (A) to 4 (C).

First, the first connector 10 is mounted to circuit board P1 and the second connector 20 is mounted to the circuit board P2. Although the intermediate connector 30 is subsequently mated with the first connector 10 and second connector 20, in the example illustrated in FIG. 3, the intermediate connector 30 is first mated with the first connector 10 before with the second connector 20. In such a case, the spacers 60 are secured with screws 61 to the circuit board P2, to which the second connector 20 is mounted. Spacers of the same length as the predetermined distance between the circuit boards P1, P2 are selected for use as the above-mentioned spacers 60. Therefore, when the above-mentioned predetermined distance is redesigned, a different spacer is selected to accommodate this change. Although the present embodiment uses spacers 60 in its preferred form, they are not essential, and the present invention does not need to involve spacers.

Next, the first connector 10 is mated with the intermediate connector 30. As can be seen in FIG. 3, when the first connector 10 passes through the frame portion 50 of the intermediate connector 30 and is mated with the connector main body 40 of the intermediate connector 30, it is allowed to remain at a shallow mating depth. In other words, the length through which the terminals 43 of the intermediate connector 30 actually slide relative to the terminals 14 of the first connector 10 (sliding length) is short, leaving the possibility to further increase the mating depth.

After that, although the above-mentioned intermediate connector 30 is mated with the second connector 20, the final mating depth varies depending on the height (length) dimensions of the above-mentioned spacers 60. FIGS. 4 (A) to 4 (C) illustrates cases where three types of spacers 60A, 60B, 60C, from tall to short, are used as said spacers 60.

Figure 4:
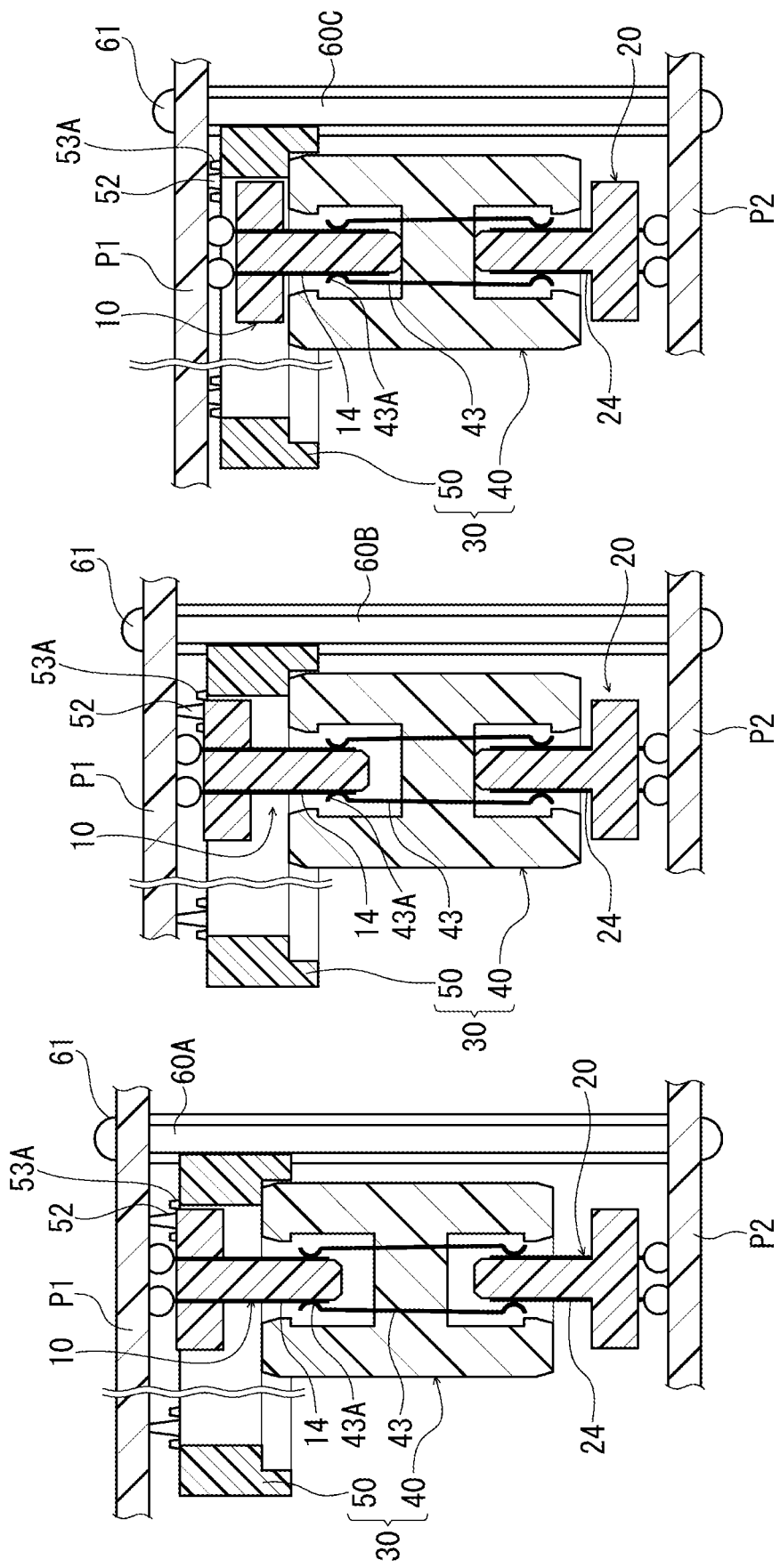
FIGS. 4 (A) to 4 (C) A cross-sectional assembled view of the connector assembly of FIGS. 2 (A) to 2 (B) using three types of spacers of different heights, wherein FIG. 4 (A) illustrates a tall spacer, FIG. 4 (B) an intermediate-height spacer, and FIG. 4 (C) a low-height spacer.

First, FIG. 4 (A) illustrates a case in which tall spacers 60A are used. In such a case, when the intermediate connector 30 is mated with the second connector 20, just after the terminals 43 of the intermediate connector 30 start sliding relative to the terminals 24 of the second connector 20, the circuit board P1 on the side of the first connector 10 abuts against the upper ends of the spacers 60A, and, for this reason, the intermediate connector 30 can no longer increase the depth of mating with the second connector 20. Even if there is a certain gap between the spacers 60A and the circuit board P1, before the connector main body 40 of the intermediate connector 30 is acted upon by the abutment force and increases the depth of mating with second connector 20, the above-mentioned circuit board P1 ends up abutting against the upper ends of the spacers 60A and makes it essentially impossible to further increase mating with the second connector 20. Since the first connector 10 and intermediate connector 30 remain mated to a shallow mating depth, the two circuit boards P1, P2 assume a long-distance positional relationship (a gap). In this state, no deformation is generated despite the fact that the protrusion portions 52 of the frame 50 abut the circuit board P1. In this manner, the distance between the two circuit boards P1, P2 is maximized.

Next, as shown in FIG. 4 (B), when using the spacers 60B, which are shorter than the spacers 60A of FIG. 4 (A), the intermediate connector 30 increases the depth of mating with the second connector 20 according to the extent to which the spacers 60B become shorter in comparison with FIG. 4 (A). In other words, the sliding length of the terminals 43 of the intermediate connector 30 with respect to the terminals 24 of the second connector 20 increases and in some cases reaches the maximum sliding length. In such a case, since the sliding force of the terminals is smaller than the value of the abutment force during the deformation of the protrusion portions 52 of the above-mentioned frame portion 50, the above-mentioned protrusion portions 52 are not deformed even when acted upon by the abutment force. Therefore, only the sliding length of the terminals 43 of the intermediate connector 30 is increased relative to the terminals 24 of the second connector 20. In this manner, the distance between the two circuit boards P1, P2 becomes smaller than that of FIG. 4 (A) according to the extent to which the sliding length in the second connector 20 is increased.

Next, as shown in FIG. 4 (C), when using spacers 60C, which are shorter than the spacers 60B of FIG. 4 (B), the intermediate connector 30 is already deeply mated with the second connector 20 and the sliding length of the terminals is also at maximum, which is why the earliest mating with said second connector 20 cannot be made deeper, the first connector 10 increases the depth of mating with the intermediate connector 30, and the terminals 14 of the first connector 10 also reach their maximum sliding length. Furthermore, since the sliding length of the terminals of the intermediate connector 30 with respect to the first connector 10 and the second connector 20 is already at maximum when the protrusion portions 52 provided on the frame portion 50 of the intermediate connector 30 are acted upon by the abutment force of the circuit board P1, the sliding length can no longer be increased and the above-mentioned protrusion portions 52 are deformed by the above-mentioned abutment force. This deformation continues until the circuit board P1 abuts the two projections 53A provided on both sides and adjacent the protrusion portions 52. For example, this deformation can be plastic crush deformation. As a result of this deformation, the distance between the two circuit boards P1, P2 is reduced to the smallest distance substantially equal to the height of the spacers 60C.

Assuming that the above-mentioned protrusion portions 52 in FIG. 4 (C) are subjected, for example, to plastic crush deformation, the protrusion portions 52 protrude laterally according to the extent of compression in the connector-height direction Z, but the above-mentioned two projections 53A provided on both sides and adjacent the protrusion portions 52 restrict such protrusion.

In addition, when the above-mentioned protrusion portions 52 and projections 53A are acted upon by the abutment force of the circuit board P1, the multiple projections 53B located within said range come in contact with the circuit board P1 such that this abutment force is uniformly distributed throughout the entire range of the frame portion 50 in the connector-length direction X.

In this manner, in each case depicted in FIG. 4 (A) to 4 (C), once the mating of the first connector 10 and second connector 20 with the intermediate connector 30 has been performed up to the predetermined depth, and the spacers 60 (60A, 60B, 60C) are secured to the circuit boards P1, P2 with the screws 61.

Next, another embodiment of the present invention will be illustrated with reference to FIGS. 5 and 6 (A) to 6 (C). In this embodiment depicted in FIGS. 5 and 6 (A) to 6 (C), parts common with the previous embodiment of FIGS. 3 and 4 are denoted using the same reference numerals and their description is omitted. In comparison with the previous embodiment, the embodiment of FIGS. 5 and 6 (A) to 6 (C) is characterized by the fact that the intermediate connector 30 is not provided with a frame portion, the intermediate connector 30 is constituted only by the connector main body 40 described in the previous embodiment, and the protrusion portions are provided in the first connector 10, while other features are identical to the previous embodiment.

Figure 5:
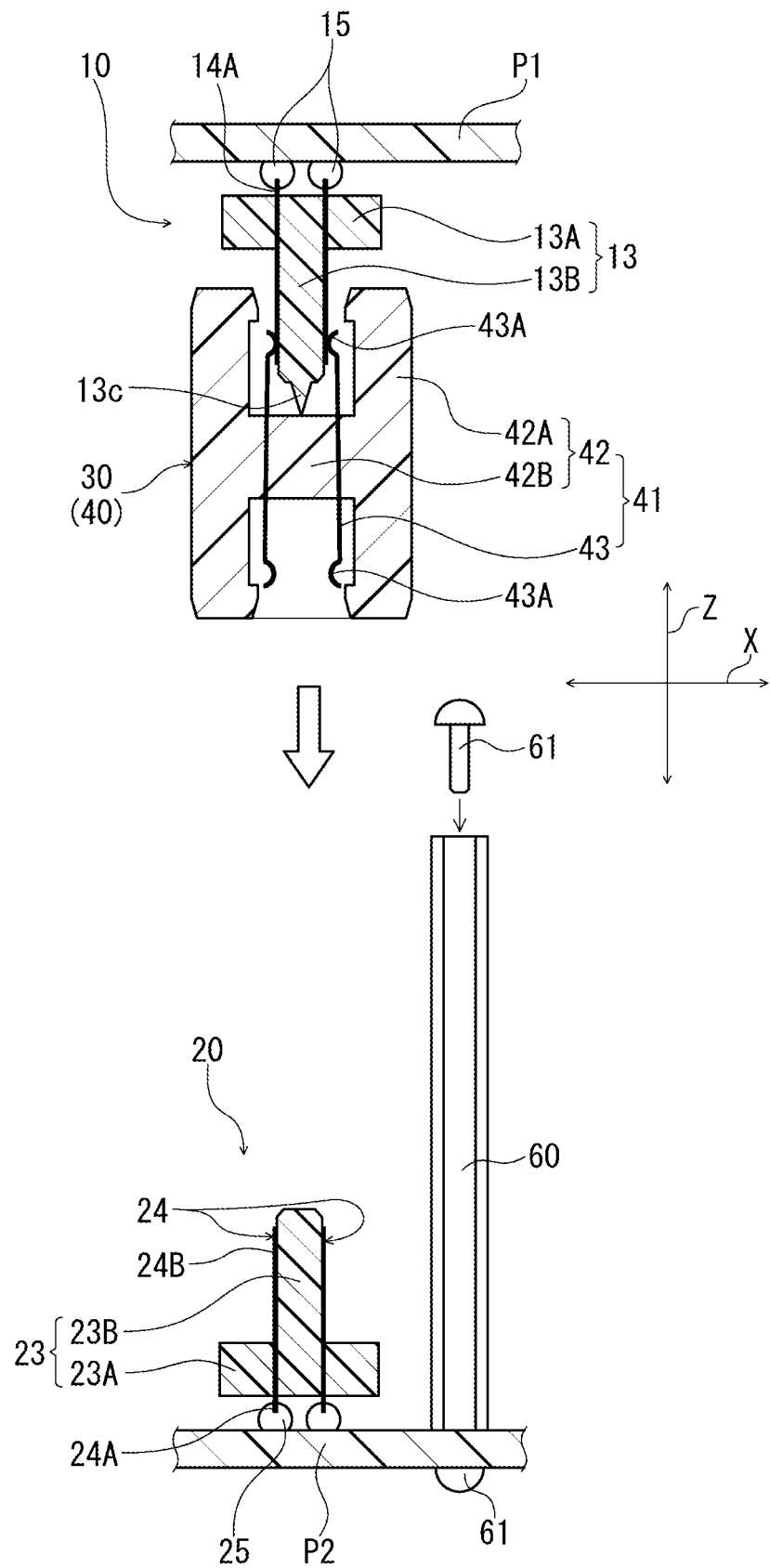
FIG. 5 A cross-sectional view illustrating the initial stage of assembly in another embodiment of the connector assembly of FIGS. 2 (A) to 2 (B).

FIG. 5 corresponds to the state of FIG. 3 of the previous embodiment. In this FIG. 5, the first connector 10 is provided with downwardly protruding protrusion portions 13C at the lower end of the vertical wall portion 13B of its element housing 13. In FIG. 5, the first connector 10 is in a shallow mating position at the start of mating with the intermediate connector 30, in other words, when the sliding length of the terminals 14 is short. In such a state, the distal ends (lower ends) of the above-mentioned protrusion portions 13C are located in close proximity to the coupling wall portion 42B of the element housing 42 of the above-mentioned intermediate connector 30.

In the present embodiment, the first connector 10 is assembled together with said intermediate connector 30 while being mounted to the circuit board P1, as shown in FIG. 5, in the initial state of mating with the intermediate connector 30. After that, the intermediate connector 30 is mated with the second connector 20 as shown in FIGS. 6 (A) to 6 (C). The mated states of this intermediate connector 30 and the second connector 20, as well as the spacers 60A, 60B, and 60C are identical to the cases of the previous embodiment illustrated in FIG. 4 (A) to 4 (C), where FIGS. 6 (A) to 6 (C) illustrate cases in which the spacers 60A, 60B, and 60C become progressively shorter.

FIG. 6 (A) is a shallow mated state of the intermediate connector 30 with the first connector 10 and second connector 20, in other words, one where the sliding length of the terminals 14 is extremely short and the distance between the two circuit boards P1, P2 is longest among FIGS. 6 (A) to 6 (C). In this state, the protrusion portions 13C of the first connector 10 are adjacent to or abut the coupling wall portion 42B of the intermediate connector 30, and no deformation whatsoever occurs.

Next, FIG. 6 (B) is a mated state in which the intermediate connector 30 increases the depth of mating with the first connector 10 according to the extent to which the spacers 60B become shorter than the spacers 60A of FIG. 6 (A), in other words, the sliding length of the terminals 24 of the second connector 20 becomes longer in comparison with FIG. 6 (A). The intermediate connector 30 is still in a shallow mating state with the first connector 10 and the protrusion portions 13C of the first connector 10 are not deformed. In this manner, in comparison with the case of FIG. 6 (A), the distance between the two circuit boards P1, P2 in FIG. 6 (B) becomes shorter according to the extent to which the sliding length in the second connector 20 is increased.

Next, in FIG. 6 (C), the spacers 60C become even shorter than the spacers 60B of FIG. 6 (B) and, for this reason, the first connector 10 can make mating with the intermediate connector 30 deeper. As a result of downwardly pressing the circuit board P1, the protrusion portions 13C of the first connector 10 undergo deformation under the action of the abutment force against the coupling wall portion 42B of the intermediate connector 30, and their dimensions in the heightwise direction become smaller, with the mating of the first connector 10 and the intermediate connector 30 becoming deeper according to the extent to which the protrusion portions 13C become shorter as a result of the deformation. In other words, the sliding length of the terminals 14 of the first connector 10 is increased. In this manner, in comparison with FIGS. 6 (A)-(B), the distance between the two circuit boards P1, P2 in FIG. 6 (C) is further reduced and becomes the shortest distance among FIGS. 6 (A) to 6 (C).

Although spacers are disposed between the circuit boards P1, P2 in the two embodiments of the invention illustrated in FIGS. 3, 4 (A) to 4 (C) and FIGS. 5, 6 (A) to 6 (C), in the present invention, the spacers are not essential, and the invention can be implemented even without spacers. In other words, by appropriately selecting the depth of mating of the first connector 10 and second connector 20 with the intermediate connector 30, it is possible to obtain the three states illustrated, for example, in FIGS. 4 (A) to 4 (C) and 6 (A) to 6 (C), or set the depth of mating to intermediate states, thereby providing different mating depths and making it possible to configure the distance between the two circuit boards P1, P2 within a wide range of arbitrary locations.

In the present invention, there are no limitations on the number of the protrusion portions. Therefore, the larger the number of the protrusion portions, the smaller the force required for deformation by the abutment force in a single protrusion portion. Furthermore, the protrusion portions may be provided in locations other than those used in the examples illustrated in the embodiments. For example, it is possible to use the upper or lower end faces of the lateral wall portions 42A of the element housing 42 of the intermediate connector 30, or the top face of the horizontal wall portion 23A of the second connector 20, and the like. In addition, they may be provided not on one connector element, but on multiple connector elements. Furthermore, there may be provided multiple frame portions 50 with protrusion portions. If multiple frame portions 50 are provided, then projections 53A alone, without any protrusion portions 52, may be provided on the frame portion 50 that abuts not the connector with which the intermediate connector 30 is mated initially, i.e., the first connector 10 in FIG. 3, but the second connector 20, with which it is mated thereafter. As a result, since the projections 53A of the frame portion 50 would directly abut the circuit board P2, the sliding force of the terminals would not act as a direct load on the second connector 20 and it would be possible to alleviate the load on the solder balls 25. Furthermore, the protrusion portions may be made up of resin-like plastic material or rubber-like elastic material.

DESCRIPTION OF THE REFERENCE NUMERALS

10 First connector
13C Protrusion portion
14 Terminal
20 Second connector
24 Terminal
30 Intermediate connector
40 Connector main body
43 Terminal
50 Frame portion
P1, P2 Circuit boards

The invention claimed is:

1. A connector assembly comprising:
three types of connector elements including a first connector and a second connector, each of which is respectively mounted to one of two mounting members, and an intermediate connector, which is located between the first connector and the second connector, and is connected to the first connector and the second connector, wherein
one of the three types of connector elements comprises protrusion portions protruding in a direction of connection of the connector elements, said protrusion portions are abuttable against other connector elements or mounting members with an abutment force, and, during connection of the connector elements, the protrusion portions are deformable through plastic crush deformation in the direction of connection by abutment forces that exceed the sliding forces acting between the terminals of the connector elements such that mating depth to the intermediate connector is reduced to a height of a spacer within the assembly.

2. The connector assembly according to claim 1, wherein the connector element that has the protrusion portions has a connector main body and a frame portion mounted to said connector main body, and the protrusion portions are provided on said frame portion.

3. The connector assembly according to claim 1, wherein the mounting members are circuit boards.

4. A plurality of connector elements incorporated into a connector assembly, the plurality of connector elements comprising:
a first connector and a second connector, each of which is configured to be mounted to one of two mounting members, and an intermediate connector, which is located between the first connector and the second connector, and is configured to be connected to the first connector and the second connector, wherein
one of the plurality of connector elements comprises protrusion portions protruding in a direction of connection of the connector elements, said protrusion portions are abuttable against other connector elements or mounting members with an abutment force, and, during connection of the connector elements, the protrusion portions are deformable through plastic crush deformation in the direction of connection by abutment forces that exceed the sliding forces acting between the terminals of the connector elements such that mating depth to the intermediate connector is reduced to a height of a spacer within the assembly.

* * * * *